US006445326B1

United States Patent
Donovan et al.

(10) Patent No.: US 6,445,326 B1
(45) Date of Patent: Sep. 3, 2002

(54) HIGH SPEED PRECISION ANALOG TO DIGITAL CONVERTOR

(75) Inventors: Brian T. Donovan; Ray S. McKaig; William B. Dress, all of Wilsonville, OR (US)

(73) Assignee: Xyron Corporation, Vancouver, WA (US)

( * ) Notice: Subject to any disclaimer, the term of this patent is extended or adjusted under 35 U.S.C. 154(b) by 0 days.

(21) Appl. No.: 09/602,596

(22) Filed: Jun. 22, 2000

(51) Int. Cl.$^7$ ................................................ H03M 1/12
(52) U.S. Cl. ...................................................... 341/155
(58) Field of Search ................................ 341/155, 157, 341/158; 395/800

(56) References Cited

U.S. PATENT DOCUMENTS

| | | |
|---|---|---|
| 5,491,828 A | 2/1996 | Intrater et al. |
| 5,613,149 A * | 3/1997 | Afek .......................... 341/155 |
| 5,969,283 A | 10/1999 | Looney et al. |
| 5,864,868 A | 12/1999 | Contois |

* cited by examiner

Primary Examiner—Brian Young
(74) Attorney, Agent, or Firm—Chernoff, Vilhauer, McClung & Stenzel, LLP

(57) ABSTRACT

An analog to digital convertor includes a pulse width modulated circuit (PWM) responsive to an analog parameter of an analog signal. The PWM circuit generates a pulse having a duty cycle proportional to the analog parameter. A counter generates a plurality of counterpulses during the pulse duty cycle and a sub-cycle pulse generator generates a series of subcycle pulses during each of the counterpulses. A latch circuit latches the state of the subcycle pulse generator at a predetermined time relative to the termination of the PWM pulse and a logic circuit counts the number of counterpulses which are generated during the PWM pulse. A most significant bit number is represented by the number of counter-pulses and a least significant bit number is determined by the state of the subcycle pulses in the latch. These two numbers added together provide a digital number representative of the analog parameter.

7 Claims, 6 Drawing Sheets

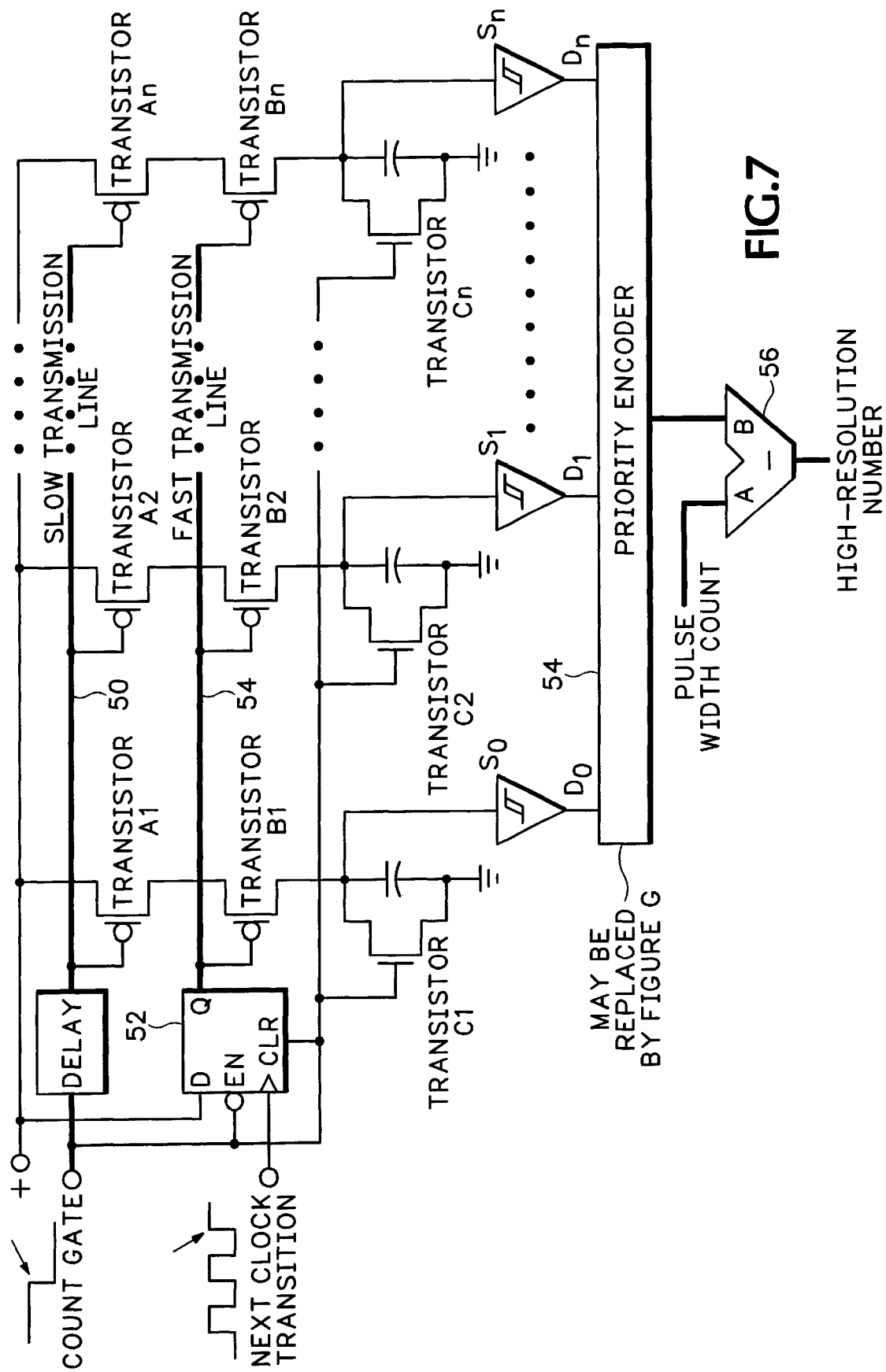

HIGH SPEED PRECISION ANALOG TO DIGITAL CONVERTOR

The following invention relates to an analog to digital convertor and, in particular, to a high speed analog to digital convertor which provides conversion from the analog domain to the digital domain with a high degree of precision and resolution.

Analog to digital converters are used to convert data such as audio from an analog format to a digital format. One way in which ADC circuits have functioned in the past is by sampling an analog wave form and converting a voltage representing the analog signal into a pulse width modulated signal. The pulse widths are then directly proportional to the input analog voltage. The width of the pulse can be converted into a digital number and a series of these variable width pulses then follows the input analog voltage. This conversion method has been generally sufficient to accurately digitize commercial quality analog audio and video signals.

There are several problems, however, with this method of analog to digital conversion. Clocked PWM convertors, such as delta-sigma convertors having, for example, a timer resolution of n, add large amounts of high frequency noise power to the digitized incoming analog signal. This high frequency noise must be filtered out, typically by using a multiple tap digital FIR filter at the cost of additional long-latency, extensive circuitry.

A typical pulse width modulated signal generator is shown in FIG. 1. A control voltage at the "high" input to an operational amplifier produces a pulse width modulated signal at the output that is proportional to the magnitude of the control voltage. Another typical type of pulse width modulation circuit is shown in FIG. 2A. FIG. 2A is what is known as a delta-sigma modulator. The problem with such modulators lies in the feedback loop which introduces noise at the analog front end of the modulator. The noise comes from clock pulses that control the sampling of the analog signal. The feedback loop drives the input waveform to a zero crossing where it is sampled by a clock pulse. There is however a degree of uncertainty in the position of the zero crossing relative to the timing of the clock pulse. It is this error that shows up as high frequency noise.

SUMMARY OF THE INVENTION

The present invention provides an analog to digital convertor utilizing a pulse width modulator (PWM) circuit responsive to an analog parameter of an analog signal in which the PWM circuit generates a PWM pulse having a period proportional to the analog parameter. A counter generates a plurality of counter pulses during the period of the PWM pulse where the number of the counter pulses is proportional to the PWM pulse width. At the same time, a subcycle pulse generator generates a series of subcycle pulses during the PWM pulse period. The subcycle pulse are much shorter than the counter pulses. A latch circuit latches the highest state of the subcycle pulse generator at a predetermined time relative to the termination of the PWM pulse. A logic circuit counts both the number of counter pulses generated during the PWM pulse and the highest logic state of the subcycle pulse generator and latches both numbers. The latched number of counter pulses forms the most significant bits of a digital number and the latched logic state of the subcycle pulse generator forms the least significant bits of a digital number which represents the value of the analog input parameter.

The subcycle pulse generator may comprise a ring oscillator having a plurality of taps where each tap represents a fractional timing interval or delay which is a subdivision of the period of each of the counter pulses. A high speed follower circuit which is triggered by outputs of the ring oscillator generates data pulses which accurately follow the output state of the ring oscillator. In this way, a state which represents an amount of delay from the leading edge of each of the counter pulses is converted into digital data which can be latched, then digitized to represent the least significant bits of the digital number.

The advantage of this circuit is that it provides much higher resolution for the digital output number without the attendant high frequency noise caused by most PWM type analog to digital convertors.

BRIEF DESCRIPTION OF THE DRAWINGS

FIG. 7 schematic diagram of a high resolution timer which may be employed in connection with the circuit of FIG. 6.

DETAILED DESCRIPTION OF THE PREFERRED EMBODIMENT

Figure 1:
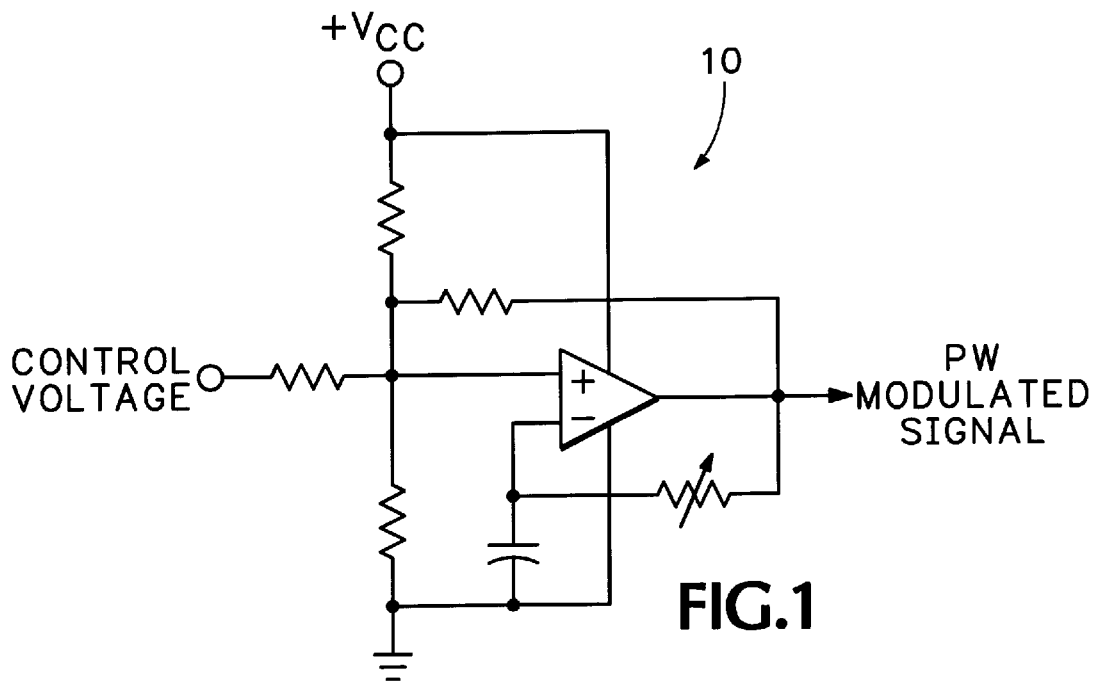
FIG. 1 is a prior art drawing of a pulse width modulated signal generator.
Figure 2A:
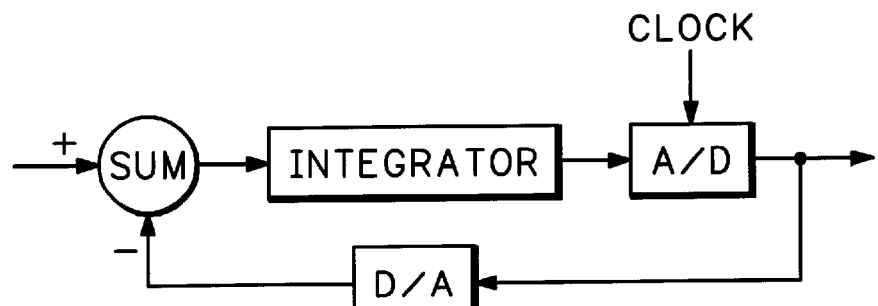
FIG. 2A is a prior art block schematic diagram of a conventional delta-sigma modulator.
Figure 2B:
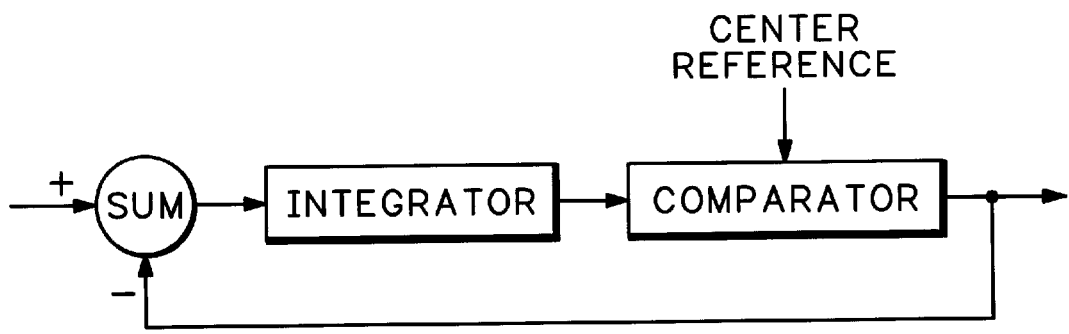
FIG. 2B is a block schematic diagram of a modified delta-sigma modulator modified to use with the invention.

Referring to FIG. 2B, a modified form of a delta-sigma converter is shown which does not require a clock input. This circuit instead produces a PWM signal whose width is linearly proportional to the amplitude of the analog input signal to control sampling of the analog signal. Precise resolution into digital form of the timing of the pulses created in the circuit of FIG. 2B are made possible by the ADC circuit of FIG. 3.

Figure 3:
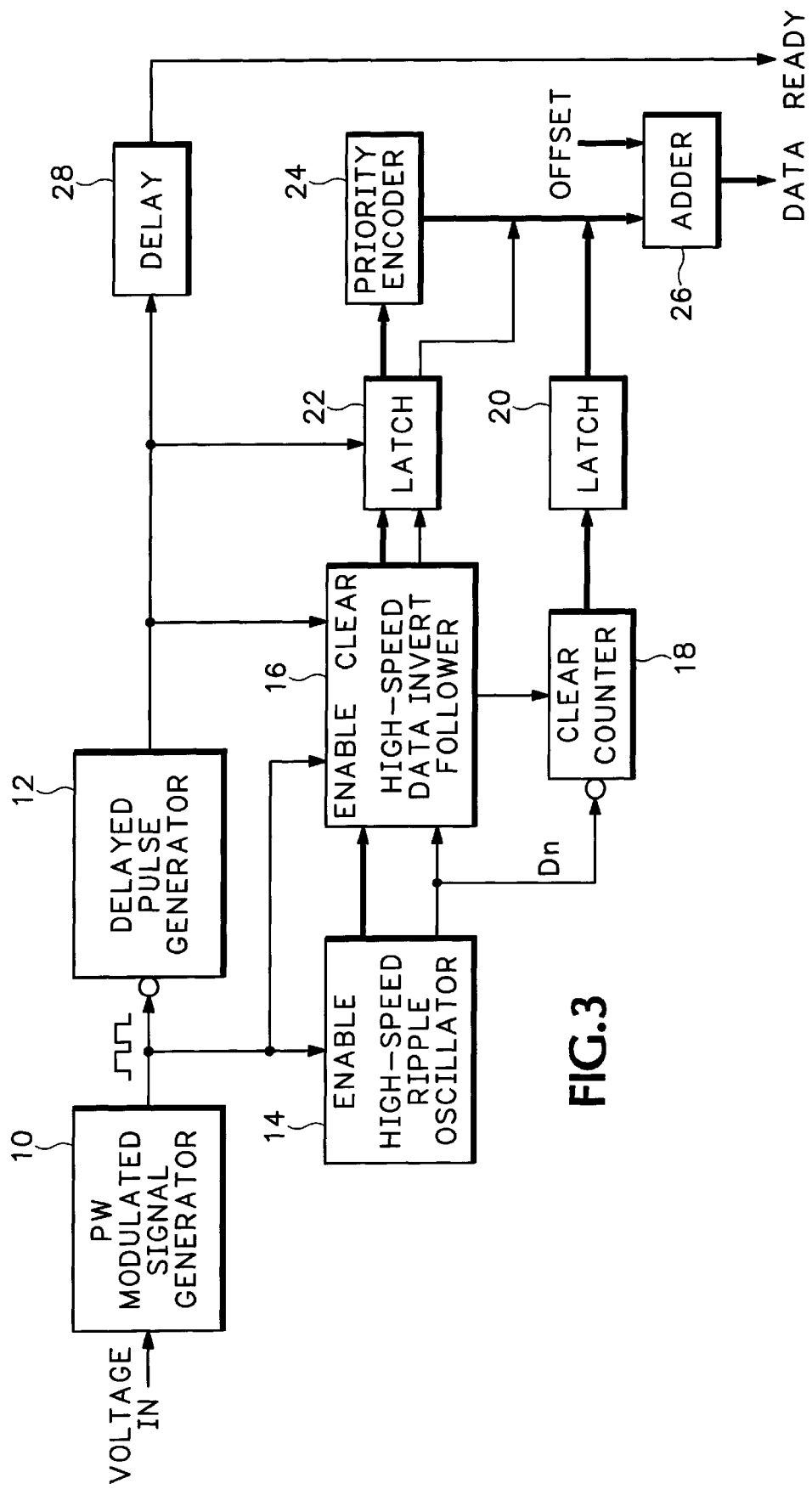
FIG. 3 is a block schematic diagram of an analog to digital convertor circuit employing the present invention.

Referring to FIG. 3, an analog voltage input is coupled to a pulse width modulated signal generator 10. This is a conventional PWM circuit that generates a pulse whose width or duty cycle is proportional to the magnitude of the analog input voltage. Other types of PWM devices may be used, some of which may be responsive to other parameters of the analog signal. In fact the invention can be used with any analog device that converts a voltage or other parameter to a duty cycle, pulse width or frequency dependant pulse train. The output of the PWM signal generator 10 is coupled to a delayed pulse generator 12. The delayed pulse generator 12 generates an output signal on the negative trailing edge of pulses from the PWM signal generator 10. The output of the PWM signal generator 10 is also coupled to a high speed ripple oscillator 14 which generates subcycle pulses during the high state in the duty cycle of each PWM pulse. Using any particular state of the PWM pulse, however, is arbitrary and the invention may be used with either the positive or negative state of the PWM pulse.

This circuit will be described more particularly with reference to FIG. 4A and 4B. The output of the high speed ripple oscillator 14 is coupled to a high speed data inverter follower circuit 16. The data inverter follower circuit 16 includes an ENABLE input and a CLEAR input. The ENABLE input is coupled to the output of the PWM signal generator 10 and the CLEAR input is coupled to the delayed pulse generator 1 2. This circuit follows the state of the ripple oscillator producing high speed pulses that correspond to the highest state of the ripple oscillator 14 when the PWM pulse ends. The high speed ripple oscillator 14 outputs its highest state $D_N$ on an output line that is connected both to the data inverter follower 16 and a counter 18. The counter 18 is a "coarse" counter. This counter counts the cycles of the ripple oscillator and generates a series of pulses during the positive portion of the output of the PWM signal generator 10. The output of the coarse counter 18 is latched in latch 20 and represents the most significant bits of a digital number. The output of the data inverter follower 16 is latched in latch 22. The output of the latch 22 is connected to a priority encoder 24. This circuit converts the state data stored in the latch 22 to a digital number that forms the least significant bits of a composite digital number. This number is combined with the output of the latch 20 in an adder circuit 26.

The output of the delayed pulse generator 12 is coupled to a delay line 28 whose output is a "ready" signal which indicates that digital data from the adder 26 is ready for processing.

Figures 4A, 4B:
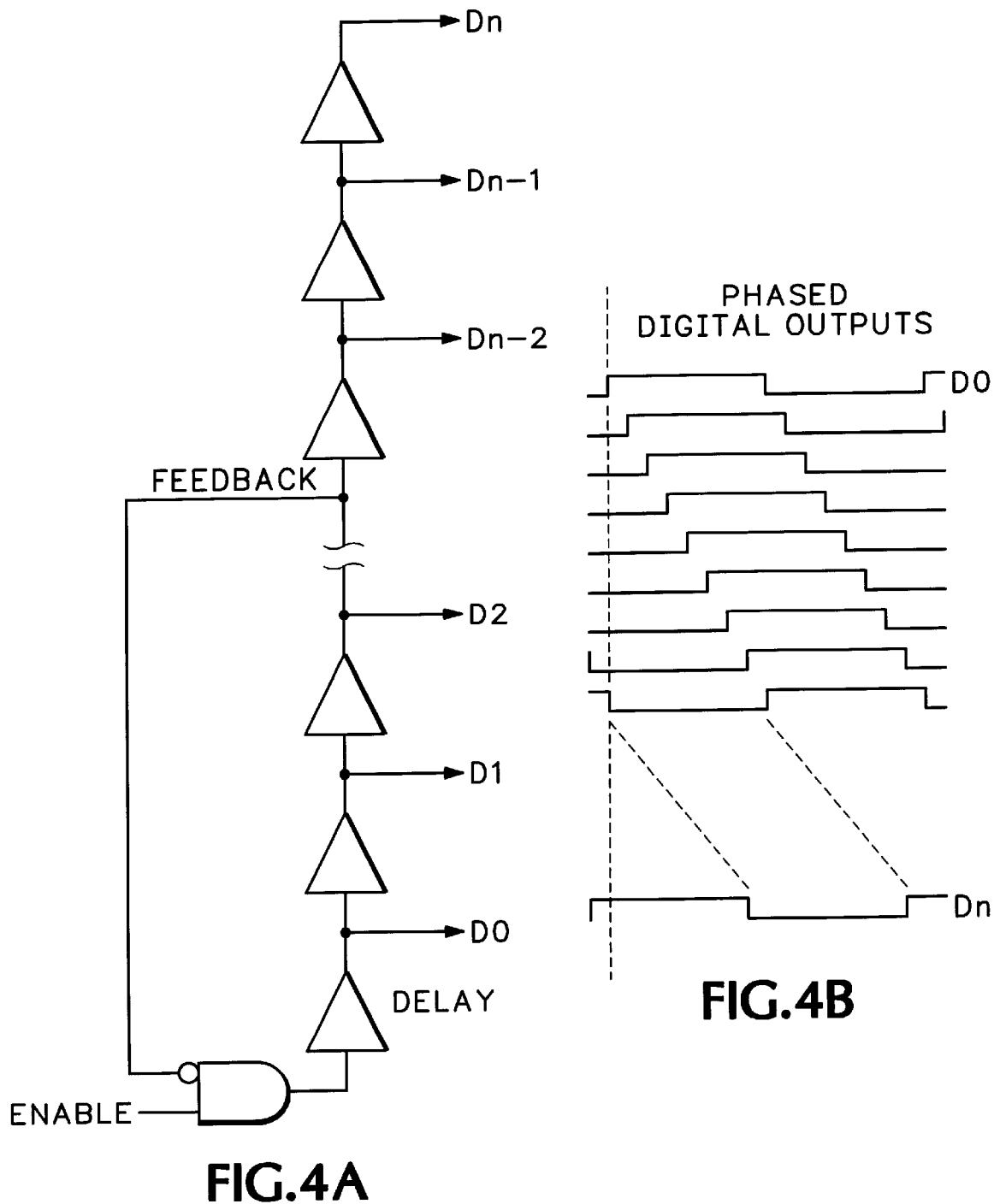
FIG. 4A is block schematic diagram of the high speed ripple oscillator of FIG. 3.
FIG. 4B is a wave form diagram illustrating the outputs of the high speed ripple oscillator circuit of FIG. 4.

Referring to FIGS. 4A and 4B, a high speed ripple oscillator comprises in essence a delay line with a feedback loop. When the PWM signal generator 10 generates a pulse, the ENABLE input to the AND gate 30 goes high. When the feedback line is low, the AND gate 30 allows the pulse from the PWM pulse generator to proceed through the delay line. The PWM pulse is phase delayed and provided to a number of taps $D_0$ through $D_N$. $D_N$ represents a period which is considerably shorter than the period of the PWM pulse. The sub-interval outputs from taps $D_0$ through $D_N$ are followed by the high speed data inverter follower 16. The purpose of the data inverter follower 16 is to convert the state of the output of the ripple oscillator 14 at the end of the pulse width timing interval to a series of pulses that define a timing interval between the last complete cycle of the ripple oscillator 14 and the end of the PWM pulse. The timing interval begins at the leading edge of the PWM signal and is terminated by the output of the delayed pulse generator 12.

Figure 5:
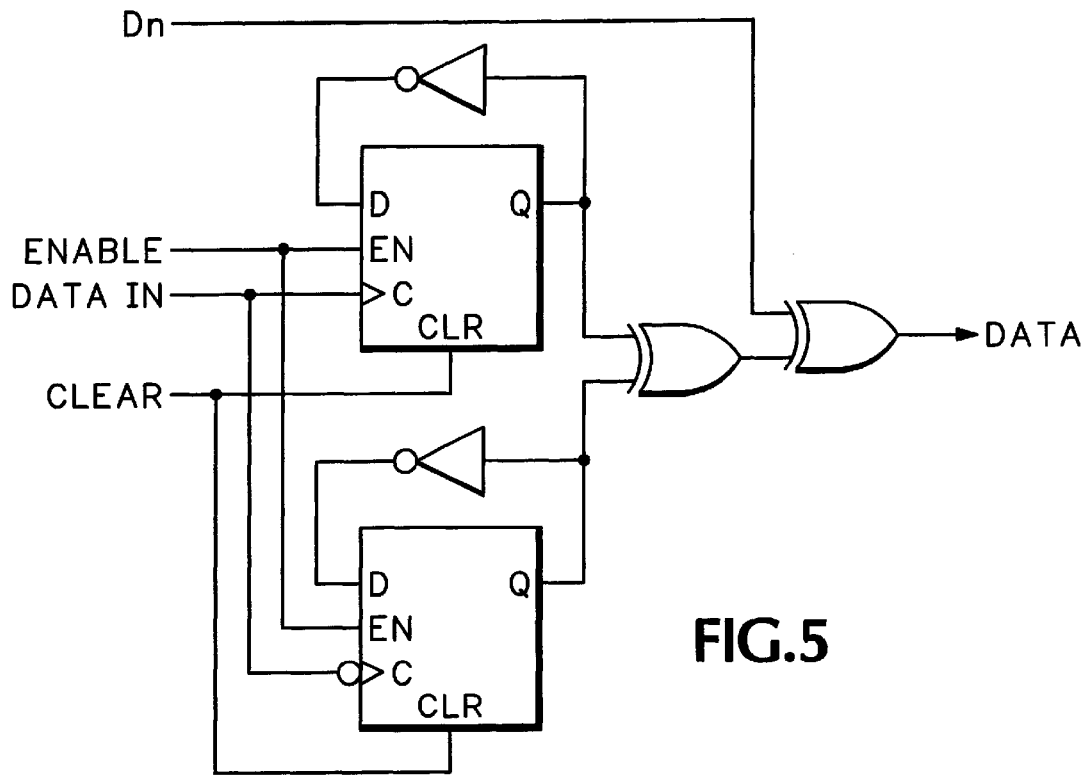
FIG. 5 is a schematic diagram of the high speed data inverter follower shown in FIG. 3.

Referring to FIG. 5, a high speed data inverter is shown which latches data input signals by using the data itself to clock and toggle two D flip-flops, each flip-flop being triggered by a different data edge. In order to combine the two flip-flop outputs, the exclusive OR gate on the flip-flop outputs reconstructs the original data signal. The effect is that the output data follows the input data and is instantly latched to maintain the oscillator's state when the timing interval ends, i.e., the ENABLE input goes to a logical "zero." It should be noted that the circuit of FIG. 5 exists for each output line $D_0$ through $D_N$ of the ring oscillator 14. This output data is instantly latched by the latch 22 to freeze the state of the high speed ripple oscillator when the timing interval ends.

The ripple oscillator's tapped outputs are not directly compatible with the priority encoder's inputs. In order to make the data compatible, it must be inverted every other half of the oscillator cycle prior to entering the latch. The highest tapped output $D_0$ through $D_N$ of the ring oscillator provides a signal for inverting the data every other half cycle. This inversion takes place in the high speed data inverter follower circuit 16 and is performed by an exclusive OR gate that has a $D_N$ input. Data is inverted only when $D_N$ is positive (the second half of the ripple oscillator's cycle). Thus, the data presented to the priority encoder 24 is always a positive going edge shifting toward the high bit position.

The priority encoder circuit 24 detects the edge location of the shifting bit state of the ripple oscillator and generates a binary number representing the position of this edge location. The highest bit output from the ripple oscillator $D_N$ is combined with the priority encoder's output as the most significant bit. This bit corresponds to what could be termed a "coarse" counter value because it counts a plurality of pulses having width $D_0$ to $D_N$ which occur during the period of the PWM pulse.

The value of the counter 18 is latched and is combined with the latched priority encoder value to provide a complete timed pulse width interval value. The output of the counter 18 forms the most significant bit and the output of the priority encoder forms the least significant bits. These are added together in adder 26. Since there is a small constant delay before the circuit begins functioning, an offset value is added to the timed value in the adder circuit 26 which completes the accurate timing value. The falling edge of the pulse from the PWM signal generator is detected in the delayed pulse generator circuit 12. The circuit 12 generates a pulse that controls the completion of each timing cycle. It latches the time data and clears the circuit for the next count. After a further delay to insure that the rest of the circuit has sufficient time to complete its functions, external circuitry is notified that the time data is stable and ready to read as signified by the "ready" output line from the delay circuit 28.

Figure 6:
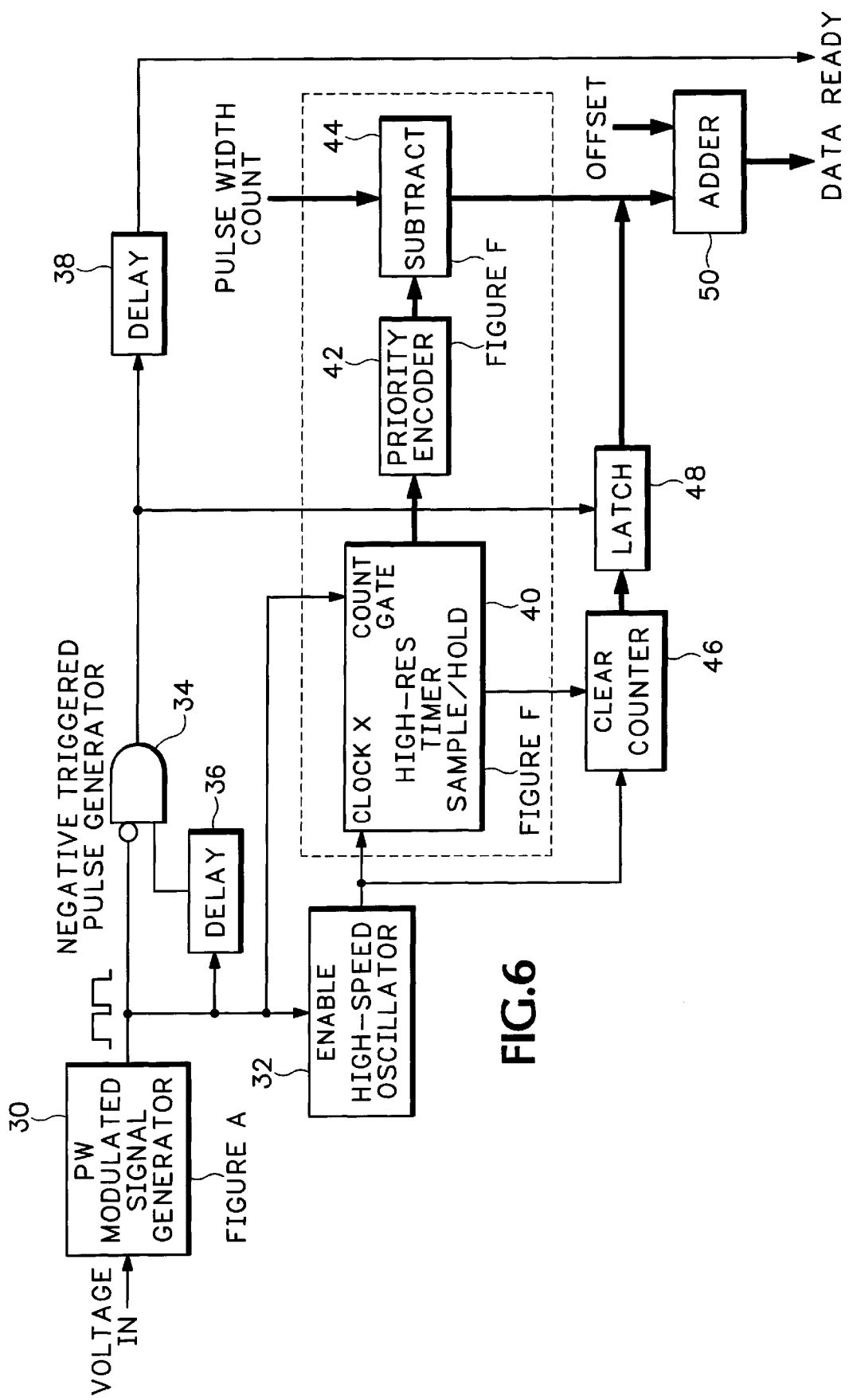
FIG. 6 is a block schematic diagram of an alternative form of the invention.

An alternative form of the invention is shown by reference to FIG. 6. A pulse width modulated signal generator 30 is coupled to a delay circuit 36 and to a NAND gate 34. The output of the NAND gate 34 is connected to the input of delay circuit 38. The output of the pulse width modulated signal generator is also coupled to the ENABLE input of high speed oscillator 32. The output of the high speed oscillator 32 is connected to the clock input of high resolution timer 40 and also to counter 46. The output of the high resolution timer 40 is coupled to the CLEAR input of counter 46. The output of the high resolution timer 40 is connected to the input of a priority encoder 42 whose output is, in turn, connected to a subtraction circuit 44. The other input to the subtraction circuit 34 is a pulse width count representing, in subcycle pulse count, the width of an oscillator pulse. The output of the counter 46 is connected to a latch 48 which is coupled to the output of NAND gate 34. The output of the subtraction circuit 44 and the output of the latch 48 are both coupled to the input of an adder circuit 50.

The circuit of FIG. 6 is in operation very similar to the circuit of FIG. 3. In this variation, the pulse width modulated signal generator 30 triggers a high speed oscillator 32. The oscillator 32 runs for a time period defined by the width of the PWM signal generator pulse. The counter 46 counts the number of cycles generated by the high speed oscillator 32 during this time period. This forms the "coarse" count as described above in connection with FIG. 3. The output of the high speed oscillator 32 is coupled to the clock input of a high speed resolution timer as shown in FIG. 7. The timer 40 is triggered by the output of the pulse width modulated signal generator 30 on the count gate input shown in FIG. 7.

The output of the high speed oscillator 32 appears on the input labeled "Next Clock Transition." The PWM pulse on the "count gate" input enters a slow transmission line 58 while the next clock transition input triggers a D flip-flop 52 whose output is connected to a fast transmission line 54. Pulses travel faster on the fast transmission line than they do on the slow transmission line. Transistors $A_1$ through $A_2$ have gates coupled to the slow transmission line and transistors $B_1$ through $B_N$ have their gates coupled to the fast transmission line 54. Storage capacitors $C_1$ through $C_N$ are coupled between the source and drains of transistors $Q_1$ through $Q_N$. Each of the transistors $Q_1$ through $Q_N$ have their gates connected to the slow transmission line 50. The capacitors $C_1$ through $C_N$ are coupled to a junction which is, in turn, connected to the transistors $B_1$ through $B_N$. The same junction is tied to switching devices which preferably are Schmitt triggers $S_1$ through $S_N$ and the outputs of the Schmitt triggers $S_1$ through $S_N$ are connected to a priority encoder 54. The output of the priority encoder is coupled to a subtraction circuit 56 as its "B" input. The "A" input to the subtractor is the pulse width count from counter 46.

In operation, the high resolution timer circuit resolves part of a single high speed clock wave form and is activated at the end of a coarse count timing cycle. This enables the circuit to determine the time after the oscillator's last positive transition and the beginning of the next PWM pulse in order to achieve higher resolution than the coarse counter can manage. This is accomplished by timing the remaining interval from the PWM gate transition until the next clock (coarse counter) rising transition, then subtracting this time from a complete oscillator clock cycle time.

Referring to FIG. 7, the subcycle timing begins with the falling edge of the count gate which is the end of the PWM pulse. This transition toggles the D flip-flop 52 to change state and turns off transistors $Q_1$ through $Q_N$. Note that when $Q_1$ through $Q_N$ are on, the capacitors $C_1$ through $C_N$ remain uncharged. At the same time the count gate input is low, transistors $A_1$ through $A_N$ begin turning on one by one with a short delay rippling through to the next transistor through the slow transmission line 58. A short time later, the rising edge from the next clock transition toggles the D flip-flop 52 and the Q output begins turning off transistors $B_1$ through $B_N$ one by one rippling down the fast transmission line. This, in turn, stops the capacitors $C_1$ through $C_N$ from charging. Since the fast transmission line has a faster signal propagation than the slow transmission line, the clock transition signal catches up with the count gate signal and prevents further capacitors from charging further down the transmission lines. Effectively, the capacitors that have been allowed to charge now represent a proportional position of the time between the count gate falling and the next clock transition rising. This position is now resolved into a number by the priority encoder and is subtracted from the oscillator's pulse width count yielding the additional time from the previous rising clock transition to the count gate falling. This number is then added to the coarse counter's value to create the complete count gate time.

Figure 8:
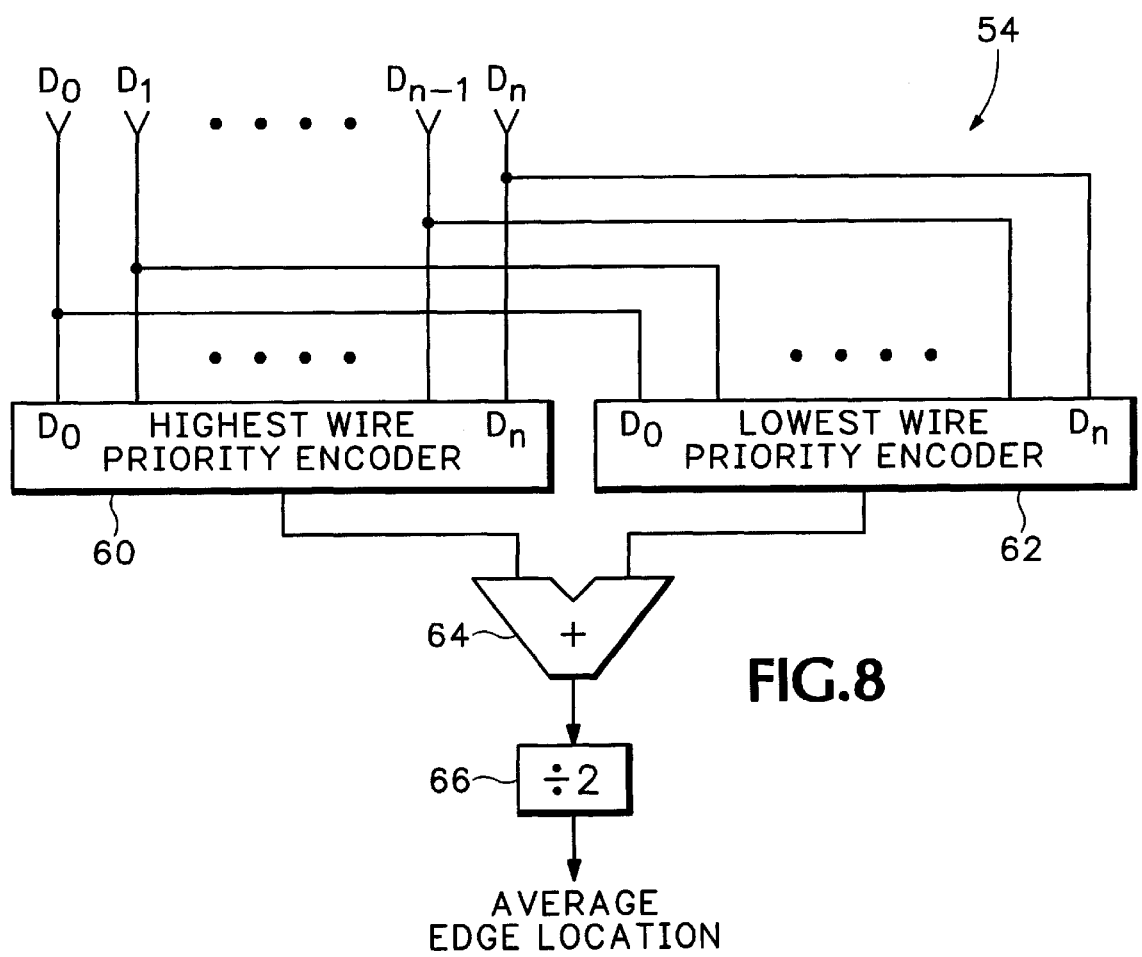
FIG. 8 is a block schematic diagram of an averaging edge detector circuit which is part of the high resolution timer of FIG. 7.

Referring to FIG. 8, the priority encoder 54 of FIG. 7 includes parallel sets of inputs from the outputs $D_0$ through $D_N$ of the respective Schmitt triggers $S_0$ through $S_N$. Each of the outputs of the Schmitt triggers are coupled to a highest wire priority encoder 60 and a lowest wire priority encoder 62. The priority encoders 60 and 62 identify the state of each output $D_0$ through $D_N$ and convert that state into a number. The highest wire priority encoder 60 looks for the highest numbered output $D_0$ through $D_N$ that is high. The lowest wire priority encoder 62 looks for the lowest numbered output on lines $D_0$ through $D_N$ that is high. Because of noise at the transition of the clock pulse the result could be different depending upon whether the sequence of examining the output lines $D_0$ through $D_N$ proceeds from high to low or vice versa. The encoders 60 and 62 produce two digital numbers based upon the state of the $D_0$ through $D_N$ output. These are averaged by adder 64 and divider 66. The output labeled average edge location is then provided as an input to the subtraction circuit 56 in FIG. 7. When the pulse width count of the oscillator clock is subtracted from this number what remains is a digital number that represents a fractional interval of time between the end of the last full clock cycle pulse and the end of the PWM pulse.

The invention has been described with reference to two types of high speed oscillator and subcycle counter circuits. However, it should be noted that other types and forms of circuits that can accomplish these functions may be used as well. In general what is needed is an oscillator or other generator of repetitive pulses during a chosen portion of the duty cycle of a PWM pulse and a means of generating subcycle pulses representing fractions of the duty cycle of the oscillator. The oscillator cycles may then be counted and the subcycles occurring in the time gap between the last oscillator pulse and the end of the PWM pulse (or between the end of the PWM pulse and the next rising oscillator pulse) may be counted and transformed into MSB and LSB portions of a digital value that now represents the exact width of the PWM pulse.

We claim:

1. An analog to digital converter comprising a PWM circuit responsive to an analog parameter of an analog signal, said PWM circuit generating a PWM pulse having a PWM duty cycle proportional to said analog parameter, a counter for generating a plurality of counter pulses during said PWM duty cycle, a subcycle pulse generator for generating a series of subcycle pulses during each of said counter pulses, a latch circuit for latching the state of the subcycle pulse generator at a predetermined time relative to the termination of said PWM pulse, and a logic circuit for counting the number of said counter pulses generated during said PWM pulse to determine an MSB number, and for counting the state of said subcycle pulses in the latch circuit to determine an LSB number, and an adder circuit for adding the MSB number and the LSB number to provide a digital number representative of said analog parameter.

2. The analog to digital convertor of claim 1 wherein said subcycle pulse generator comprises an oscillator having a plurality of delay taps, each tap representing a fractional timing interval which is a subdivision of a counter pulse width.

3. The analog to digital convertor of claim 2 wherein the subcycle pulse generator further circuit comprises a high speed follower circuit triggered by outputs of the oscillator to generate data pulses that follow the state of the oscillator.

4. A precision analog to digital convertor comprising:
   a. a PWM circuit having an analog input and generating a modulated signal pulse having a period proportional to the analog input,
   b. a counter triggered by said modulated signal pulse for generating data pulses during the period of each modulated signal pulse,
   c. a subcycle pulse generator for producing subcycle signals representing fractional periods of each of said data pulses,
   d. a latch circuit for latching the counter and an output of the subcycle pulse generator at the end of the period of the modulated signal pulse, and
   e. an encoder for combining the latched data pulses with the latched subcycle pulse generator output to derive a digital number representing the analog input to the PWM circuit.

5. The precision Analog to digital convertor of claim 4 wherein said subcycle pulse generator is an oscillator having a plurality of output states, each state representing a fractional delay from the beginning of each PWM pulse.

6. The precision analog to digital convertor of claim 4 wherein the subcycle pulse generator is a high speed transmission line having a plurality of taps, each tap representing a delay from the beginning of each PWM pulse.

7. A precision ADC comprising
   (a) PWM pulse means for generating a PWM pulse having a width proportional to an analog input,
   (b) coarse counter means triggered by said PWM pulse for generating a series of coarse counter pulses during a time interval defined by said width of said PWM pulse,
   (c) subcycle pulse means coupled to said coarse counter means for generating subcycle pulses having durations shorter than each of said coarse counter pulses,
   (d) logic means for counting the number of coarse counter pulses generated during said time interval to represent an MSB number,
   (e) encoder means for counting the number of said subcycle pulses generated during a time period between an end of a last coarse counter pulse generated during said time interval and an end of said time interval to determine an LSB digital number, and
   (f) adder means for adding said MSB and LSB numbers.

* * * * *

UNITED STATES PATENT AND TRADEMARK OFFICE
CERTIFICATE OF CORRECTION

PATENT NO. : 6,445,326 B1
APPLICATION NO. : 09/602596
DATED : September 3, 2002
INVENTOR(S) : Brian T. Donovan and Ray S. McKaig It is certified that error appears in the above-identified patent and that said Letters Patent is hereby corrected as shown below:

<u>Col.3, Line 11</u> "pulse generators 1_2" should be -- pulse generators 12. --

<u>Col. 3, Line 24</u> "priority encoder 24" should be -- priority encoder circuit 24 --

<u>Col. 4, Line 9</u> " priority encoder 24" should be -- priority encoder circuit 24 --

<u>Col. 4, Line 39</u> "NAND gate" should be -- AND gate with one inverted input --

<u>Col. 4, Line 40</u> "NAND gate" should be -- AND gate with one inverted input --

<u>Col. 4, Line 53</u> "NAND gate" should be -- AND gate with one inverted input --

<u>Col. 5, Line12</u> "through $Q_n$___Each" should be -- $Q_n$. Each --

<u>Col. 6, Line 49</u> "further circuit" should be -- "circuit further --

<u>FIG 7</u> "54" should be -- 24 --

Signed and Sealed this

Third Day of October, 2006

JON W. DUDAS
*Director of the United States Patent and Trademark Office*